United States Patent [19]

Shrivastava et al.

[11] Patent Number: 5,672,535
[45] Date of Patent: Sep. 30, 1997

[54] METHOD OF FABRICATING DRAM CELL WITH SELF-ALIGNED CONTACT

[75] Inventors: Ritu Shrivastava, Fremont; C. N. Reddy, Los Altos Hills, both of Calif.

[73] Assignee: Alliance Semiconductor Corporation, San Jose, Calif.

[21] Appl. No.: 654,615

[22] Filed: May 29, 1996

Related U.S. Application Data

[62] Division of Ser. No. 456,080, May 31, 1995.
[51] Int. Cl.⁶ ............................................. H01L 21/8242
[52] U.S. Cl. ............................. 437/52; 437/60; 437/919
[58] Field of Search ................................ 437/52, 60, 919

[56] References Cited

U.S. PATENT DOCUMENTS 5,053,351  10/1991  Fazan et al. .................. 437/52
5,126,916   6/1992  Tseng .
5,262,662  11/1993  Gonzalez et al. .
5,429,976   7/1995  Hong et al. .
5,434,812   7/1995  Tseng .
5,504,704   4/1996  Sato et al. .

*Primary Examiner*—Jey Tsai
*Attorney, Agent, or Firm*—Limbach & Limbach L.L.P.

[57] ABSTRACT

A structure and method are provided for reducing DRAM cell area by eliminating the contact-to-gate spacing requirement while increasing the capacitor area by designing the capacitor to extend inside the contact, without sacrificing the sidewall capacitance. The new structure uses a self-aligned contact where the contact can overlap the gate region in the layout.

6 Claims, 4 Drawing Sheets

METHOD OF FABRICATING DRAM CELL WITH SELF-ALIGNED CONTACT

This is a divisional of application Ser. No. 08/456,080 filed May 31, 1995 of Ritu Shrivastava et al. for DRAM CELL WITH SELF-ALIGNED CONTACT AND METHOD OF FABRICATING SAME.

BACKGROUND OF THE INVENTION

1. Field of the Invention

The present invention relates to dynamic random access memories (DRAMs) and, in particular, to a DRAM cell structure with a self-aligned contact which reduces cell size while maintaining high cell capacitance.

2. Discussion of the Relevant Art

Reduction in the size of a DRAM cell utilizing a stacked gate cell capacitor is limited by the design rule for the transistor's contact-to-gate spacing. This is because the layout must account for mask misalignment in forming the contact to the gate utilizing conventional lithographic processing techniques. Also, as DRAM cell size becomes smaller, the cell capacitance becomes unacceptably small. A small cell capacitance reduces the sense amplifier signal, thereby deteriorating DRAM robustness and worsening the soft-error performance problem.

A variety of DRAM cell innovations for increasing the capacitance while keeping the cell area small have been reported in DRAM cell literature. A good review of different approaches can be found in Chapters 4 and 6, "Semiconductor Memories—A Handbook of Design, Manufacture, and Applications," John Wiley & Sons, 1991, by Betty Prince.

FIGS. 1a and 1b illustrate a prior art DRAM cell 10, commonly called a Stacked Capacitor Cell (STC). FIG. 1a shows a cross-section of the STC, while FIG. 1b shows the corresponding layout.

In accordance with the process flow for fabricating the STC structure, the device active area 12 and the transistor gate 14 (poly1) are defined in the conventional manner. After deposition of the interlayer dielectric 16, a contact mask is used to etch contact trench 18. Bottom poly (poly2) is then deposited and patterned to form the bottom plate 20 of the capacitor which is connected to the transistor source 22 via the contact trench 18. Capacitor dielectric 24 is then grown or deposited on the poly2 bottom plate 20. The top poly (poly3) is then deposited and patterned to provide the poly3 top plate 26 of the capacitor, completing the basic STC structure. Other layers of the STC structure not relevant to the present discussion are not shown.

The area of the interpoly dielectric 24 between poly2 bottom plate 20 and poly3 top plate 26 determines the STC's coupling capacitance. Referring to the FIG. 1a cross-section, it should be noted that typical diameter of the contact trench 18 is 0.5 µm, whereas the thickness is about 5KÅ. The CVD poly2 completely fills the contact trench 18 and, thus, the capacitor area basically lies above the contact, not in the contact. Reducing the poly2 thickness would allow the capacitor to be formed inside the contact trench 18, but it also reduces the sidewall capacitor area. A relatively thicker poly2 also does not produce a vertical profile inside the contact trench 18, and the capacitance may not be very reproducible. It should be noted that, in the above-described technique and it's variations, the contact trench 18 must be placed sufficiently far away from the transistor gate 14 to allow for lithography misalignment. This increases the cell size.

FIGS. 2a and 2b show an improvement over the STC structure shown in FIGS. 1a and 1b. This improved DRAM cell structure 50 results in the cell capacitor being formed inside the contact trench, thus resulting in a higher cell capacitance. FIG. 2a shows the cross-section of the DRAM cell; the corresponding layout is shown in FIG. 2b.

A variety of process sequences can be utilized in fabricating the structure shown in FIGS. 2a and 2b. There can even be some variations in the layer deposition and patterning sequence. In accordance with one process flow, device active area 52 and transistor gate 54 (poly 1) are defined in the conventional manner. After deposition of the interlayer dielectric 56, an extra layer of thick poly 58 (poly2) is deposited. The thickness of poly 58 typically can be in the 2KÅ to 10KÅ range. A contact mask is then used to pattern and etch contact trench 60 by first etching the thick poly2 58 and then the dielectric 56. A thin poly layer (poly3), in the range of 200Å to 1.5KÅ thick, is then deposited and patterned to form the bottom plate of the capacitor. The bottom plate, constituted now by poly2 58 and poly3 62, connects to the transistor source 63 via contact trench 60. Note that poly2 58 and poly3 62 are patterned and etched together, thus reducing the number of masking steps. This process also avoids extra overlap required on both sides of the lower poly2 58 by upper poly3 62, thereby reducing the cell size. Capacitor dielectric 64 is then grown or deposited on the poly3 plate 62. The top poly (poly4) is then deposited and patterned to form upper plate 66, completing the basic structure of the DRAM cell. Other layers of the device structure not relevant to the present discussion are not shown.

The area of the interpoly dielectric 64 between the lower poly2/3 plate and the upper poly4 plate determines it's capacitance. It should be noted that for a given technology and typical diameter of the contacts, the poly3 thickness is chosen such that the contact trench 60 is not filled after the capacitor dielectric growth or deposition. The capacitor thus can extend into the contacts.

A variation of the above structure can be obtained by patterning the poly2 58 before depositing poly3 by using the mask represented by layer 62 in FIG. 2b or it's oversized mask. This may give a more uniform capacitor dielectric growth by eliminating the poly2/poly3 interface in the sidewalls, but increases the number of masks.

Neither of the above-described structures attempts to reduce the DRAM cell size by utilizing a self-aligned contact.

SUMMARY OF THE INVENTION

The present invention provides a technique for reducing DRAM cell area by eliminating the contact-to-gate spacing requirement while increasing the capacitor area by designing the capacitor to extend inside the contact, without sacrificing the sidewall capacitance. The new structure uses a self-aligned contact where the contact can overlap the gate region in the layout.

Other features and advantages of the present invention will become apparent and be appreciated by reference to the following detailed description which should be considered in conjunction with the accompanying drawings.

DETAILED DESCRIPTION OF THE INVENTION

The following detailed description is of the best modes presently contemplated by the inventor for practicing the invention. It should be understood that the description of these preferred embodiments is merely illustrative and should not be taken as limiting of the claimed invention.

Figure 3A:
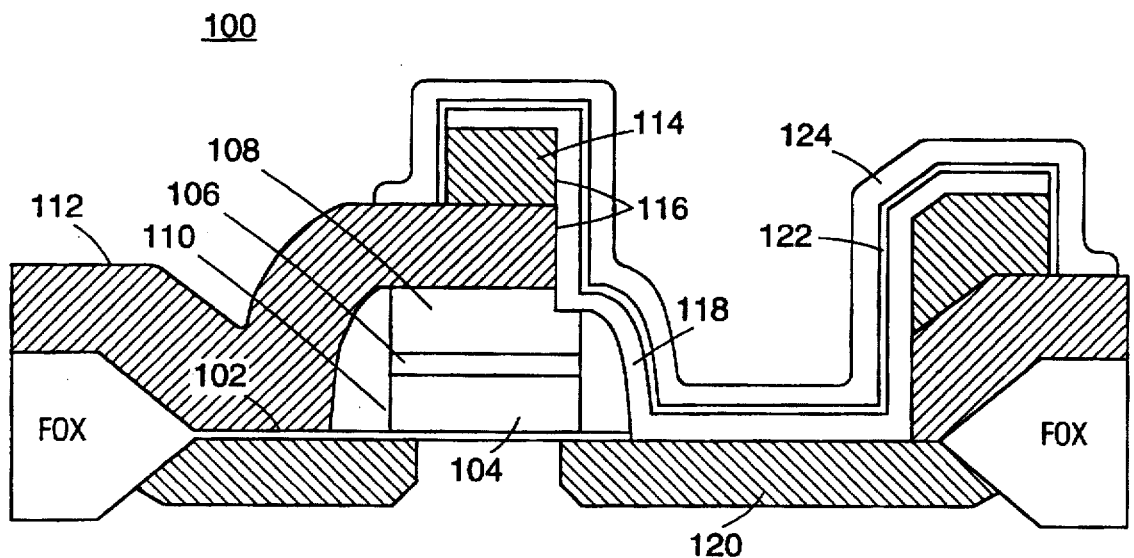
FIGS. 3a and 3b show the cross-section and layout, respectively, of a DRAM cell with a self-aligned contact formed in accordance with the present invention.
Figure 3B:
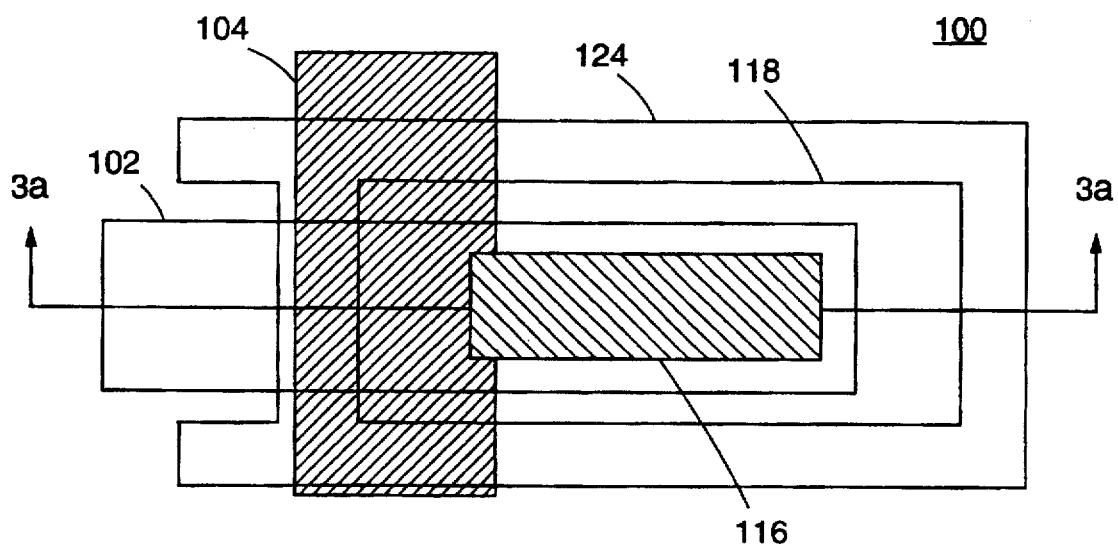

FIGS. 3a and 3b show a DRAM cell 100 that incorporates a self-aligned contact, thereby allowing the cell size to be reduced. FIG. 3a shows a cross-section of the DRAM cell 100; the corresponding layout of the cell 100 is shown in FIG. 3b.

A variety of fabrication sequences can be used to provide the cell 100 shown in FIGS. 3a and 3b. One embodiment of a process flow to achieve the self-aligned structure of cell 100 is discussed below.

First, active area 102 is defined in the conventional manner. The transistor gate 104 is patterned and etched after deposition of gate poly (poly1), a silicide layer 106 (e.g., Tungsten silicide), and a dielectric layer 108 (e.g., TEOS oxide), all in accordance with conventional techniques. Next, dielectric deposition and etching steps are performed to produce sidewall spacers 110; the dielectric may be LTO or other conventional dielectric material suitable for this purpose. A layer of dielectric 112, such as LTO, is then deposited; the thickness of dielectric 112 is such that it can be etched reproducibly (later) without etching too much into dielectric 108. A layer of thick poly 114 (poly2) is then deposited. The thickness of this poly2 typically can be in the 2KÅ to 10KÅ range. A contact mask is used to pattern and etch contact trench 116, by first etching the poly2 114 and then the dielectric 112. A thin poly layer (poly3), in the range of 200Å to 1.5KÅ thick, is then deposited and patterned to form the poly3 plate 118 of the capacitor, which connects the transistor source 120 to bottom capacitor plate constituted now by poly2 114 and poly3 118. It should be noted that the contact etch should clear the gate dielectric in the source region 120 reproducibly while ensuring that dielectric 108 is not etched significantly to allow a high capacitance or shorts between poly3 118 and the transistor gate 104/106. Capacitor dielectric 122 is then grown or deposited on poly3 118. The top poly (poly4) is then deposited and patterned to provide the upper capacitor plate 124, completing the basic structure of the DRAM cell 100. Other layers of the final device structure not relevant to present discussion are not shown. The area of the interpoly dielectric 122 between poly2/3 lower plate 114/118 and poly4 upper plate 124 determines it's capacitance.

Figure 1A:
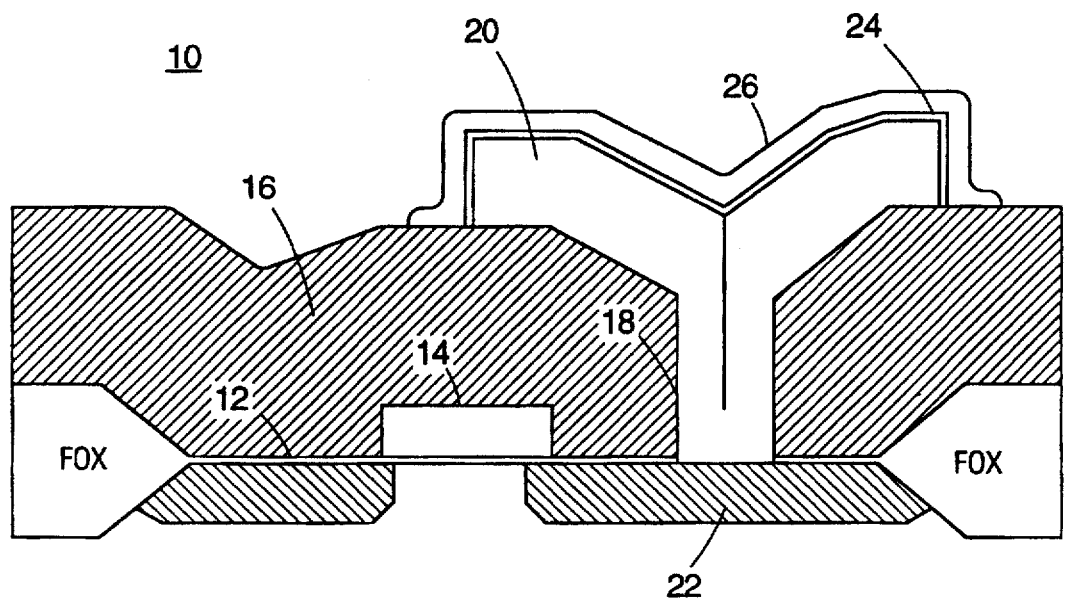
FIGS. 1a and 1b show the cross-section and layout, respectively, of a prior art DRAM Stacked Capacitor Cell.
Figure 1B:
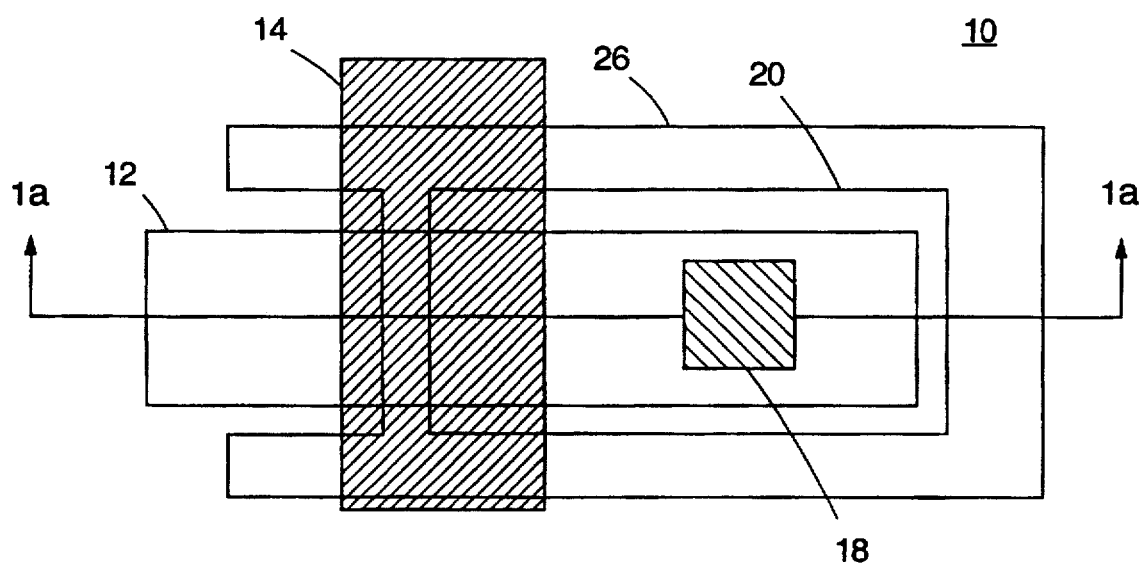
Figure 2A:
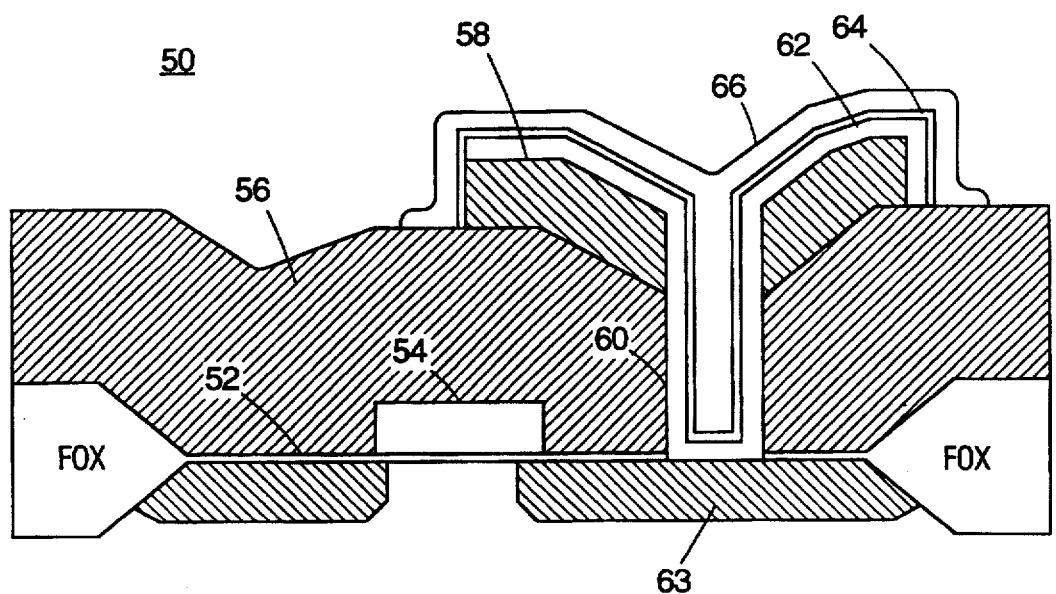
FIGS. 2a and 2b show the cross-section and layout, respectively, of another prior art DRAM cell.
Figure 2B:
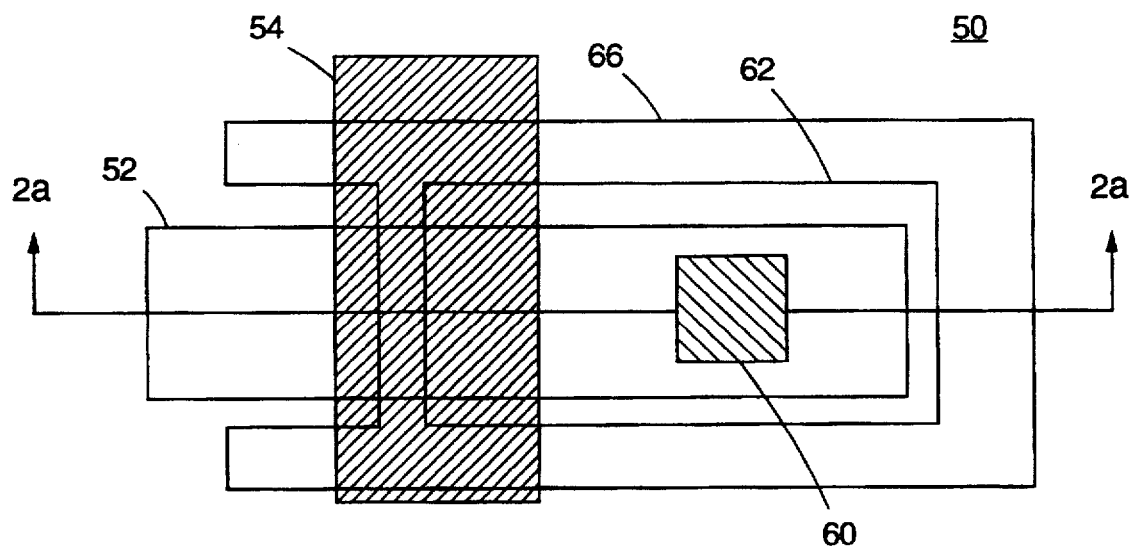

It should be noted that, for a given technology, the cell size for this implementation can be smaller than that shown in either the FIGS. 1a/1b or the FIGS. 2a/2b structures. At the same time, the contact size can be larger than in these prior art cells. This is because there is no design rule for contact to gate spacing, and the poly3 118 contacts the source 120 in a "self-aligned" manner, i.e., regardless of the location of the contact edge on top of the poly gate 104/106, the physical poly3-to-source interface on the gate side is unchanged.

Figure 4:
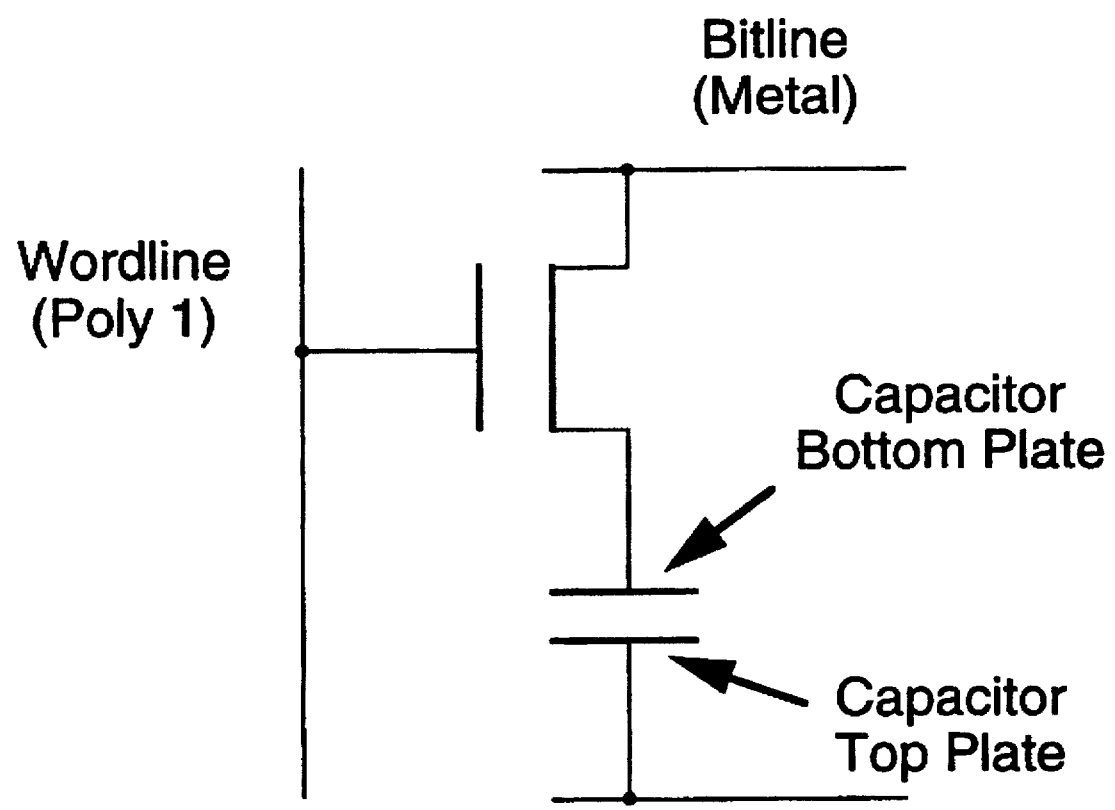
FIG. 4 is a schematic representation of the DRAM cell shown in FIGS. 3a and 3b and illustrating the use of the poly layers.

FIG. 4 provides a schematic representation of the cell 100 described above in conjunction with FIGS. 3a and 3b illustrating the various interconnect layers forming the cell.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications that fall within the true spirit and scope of the invention.

What is claimed is:

1. A method of fabricating a dynamic random access memory (DRAM) structure in a semiconductor substrate having a first conductivity type, the DRAM structure including source and drain regions of a second conductivity type that is opposite to the first conductivity type formed in the semiconductor substrate in spaced-apart relationship to define a channel region therebetween, a layer of gate dielectric material formed on a surface of the semiconductor substrate above the channel region and extending to at least partially overlap the source region and the drain region, and a conductive gate formed on the layer of gate dielectric material over the channel region, the method comprising:

forming a layer of first dielectric material on the conductive gate to define, in combination with the conductive gate, a stacked gate structure;

forming a dielectric sidewall spacer structure on sidewalls of the stacked gate structure and such that at least a first portion of the sidewall spacer structure is formed on gate dielectric materials that overlaps the drain region and at least a second portion of the sidewall spacer structure is formed on gate dielectric material that overlaps the source region;

forming a layer of second dielectric material over the first dielectric material and extending over the drain region such that the second dielectric material is separated from the drain region by gate dielectric material and the first portion of the sidewall spacer structure, and extending over the source region such that the second dielectric material is separated from the source region by gate dielectric material and the second portion of the sidewall spacer structure;

forming a contact trench in the second dielectric material, the contact trench having a first edge that is at least partially aligned over the conductive gate and is at least partially defined by the second portion of the sidewall spacer structure, and a second edge that is aligned over the source region, the contact trench defining an exposed surface of the source region;

forming a conductive lower capacitor plate at least partially over the second dielectric material and to conformally cover the first and second edges of the contact trench and the exposed surface of the source region by forming a first layer of conductive material having a first thickness on the first and second edges of the contact trench and then forming a second layer of conductive material having a second thickness that is less than the first thickness on the first layer;

forming a layer of capacitor dielectric material over the lower capacitor plate; and forming a conductive upper capacitor plate over the capacitor dielectric material.

2. A method as in claim 1 wherein the first conductivity type is P-type and the second conductivity type is N-type.

3. A method as in claim 1 wherein the conductive gate comprises a layer of first polysilicon having a layer of metal silicide formed thereon.

4. A method as in claim 3 wherein both the lower capacitor plate and the upper capacitor plate comprise polysilicon.

5. A method as in claim 1 and wherein the step of forming the conductive lower capacitor plate comprises depositing a first layer of polysilicon having a first thickness on the first and second edges of the contact trench, depositing a second layer of polysilicon having a second thickness that is less than the first thickness on the first layer, and patterning the first and second layers of polysilicon to define same lower capacitor plate.

6. A method as in claim 1 and further comprising, after the step of forming the layer of second dielectric material, forming a thick conductive layer such that the step of forming the contact trench comprises forming the contact trench in the thick conductive layer and the layer of second dielectric.

* * * * *

US005672535C1

(12) EX PARTE REEXAMINATION CERTIFICATE (9703rd)
United States Patent
Shrivastava et al.

(10) Number: US 5,672,535 C1
(45) Certificate Issued: Jun. 12, 2013

(54) METHOD OF FABRICATION DRAM CELL WITH SELF-ALIGNED CONTACT

(75) Inventors: Ritu Shrivastava, Fremont, CA (US); C. N. Reddy, Los Altos Hills, CA (US)

(73) Assignee: Advanced Data Access LLC, Frisco, TX (US)

Reexamination Request:
No. 90/012,077, Jan. 5, 2012
No. 90/012,480, Sep. 10, 2012

Reexamination Certificate for:
Patent No.: 5,672,535
Issued: Sep. 30, 1997
Appl. No.: 08/654,615
Filed: May 29, 1996

Related U.S. Application Data

(62) Division of application No. 08/456,080, filed on May 31, 1995, now abandoned.

(51) Int. Cl.
*H01L 27/108* (2006.01)

(52) U.S. Cl.
USPC ..... 438/396; 438/586; 438/979; 257/E27.086

(58) Field of Classification Search
None
See application file for complete search history.

(56) References Cited

To view the complete listing of prior art documents cited during the proceedings for Reexamination Control Numbers 90/012,077 and 90/012,480, please refer to the USPTO's public Patent Application Information Retrieval (PAIR) system under the Display References tab.

*Primary Examiner* — Erik Kielin

(57) ABSTRACT

A structure and method are provided for reducing DRAM cell area by eliminating the contact-to-gate spacing requirement while increasing the capacitor area by designing the capacitor to extend inside the contact, without sacrificing the sidewall capacitance. The new structure uses a self-aligned contact where the contact can overlap the gate region in the layout.

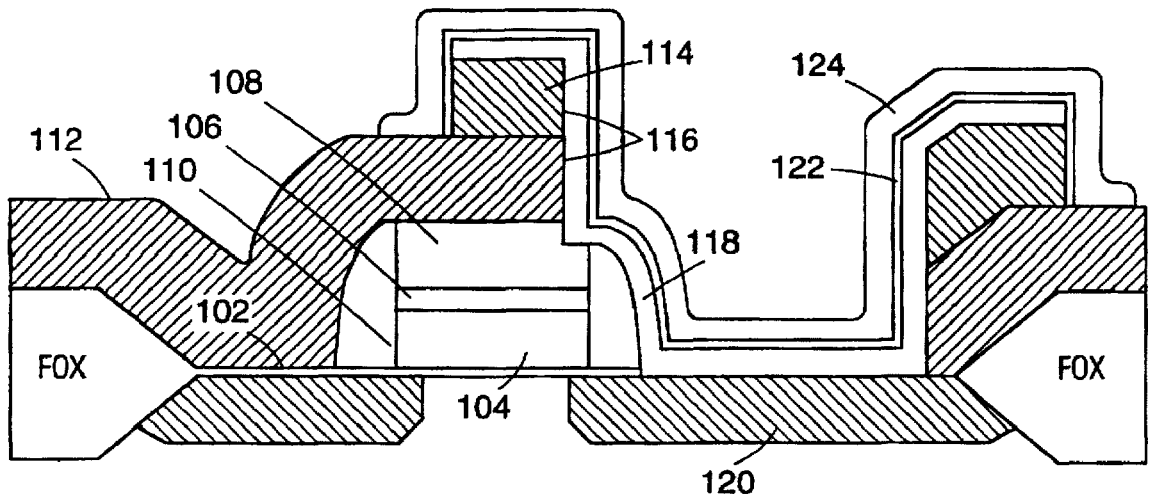

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 4, line 1:

*Below describes a method of fabricating a dynamic random access memory (DRAM) structure (100) in a semiconductor substrate which has a first conductivity type, wherein the DRAM structure (100) includes source (120) and drain regions of a second conductivity type that is opposite to the first conductivity type formed in the semiconductor substrate in a spaced-apart relationship to define a channel region therebetween. The DRAM further includes a layer of gate dielectric material formed on a surface of the semiconductor substrate above the channel region and extending to at least partially overlap the source region (120) and the drain region, and a conductive gate (104/106) formed on the layer of gate dielectric material over the channel region.*

*The method includes forming a layer of first dielectric material (108) on the conductive gate (104/106) to define, in combination with the conductive gate (104/106), a stacked gate structure.*

*The method also includes forming a dielectric sidewall spacer structure (110) on sidewalls of the stacked gate structure and such that at least a first portion of the sidewall spacer structure is formed on the gate dielectric material that overlaps the drain region and at least a second portion of the sidewall spacer structure is formed on gate dielectric material that overlaps the source region (120).*

*The method also includes forming a layer of second dielectric material (112) over the first dielectric material (108) and extending over the drain region such that the second dielectric material (112) is separated from the drain region by gate dielectric material and the first portion of the sidewall spacer structure (110), and extending over the source region (120) such that the second dielectric material (112) is separated from the source region (120) by gate dielectric material and the second portion of the sidewall spacer structure.*

*The method also includes forming a contact trench (116) in the second dielectric material (112), the contact trench (116) having a first edge that is at least partially aligned over the conductive gate (104/106) and is at least partially defined by the second portion of the sidewall spacer structure, and a second edge that is aligned over the source region (120), the contact trench (116) defines an exposed surface of the source region (120).*

*The method also includes forming a conductive lower capacitor plate (114/118) at least partially over the second dielectric material (112) and to cover the first and second edges of the contact trench (116) and the exposed surface of the source region (120).*

*The method also includes forming a layer of capacitor dielectric material (122) over the lower capacitor plate (114/118).*

*Finally, the method also includes forming a conductive upper capacitor plate (124) over the capacitor dielectric material (122).*

AS A RESULT OF REEXAMINATION, IT HAS BEEN DETERMINED THAT:

Claims 1-4 are cancelled.

Claims 5 and 6 were not reexamined.

* * * * *